US012560871B2

(12) United States Patent
Hill et al.

(10) Patent No.: US 12,560,871 B2
(45) Date of Patent: Feb. 24, 2026

(54) METROLOGY TARGET FOR SCANNING METROLOGY

(71) Applicant: KLA Corporation, Milpitas, CA (US)

(72) Inventors: Andrew V. Hill, Berkley, CA (US); Amnon Manassen, Haifa (IL); Gilad Laredo, Haifa (IL); Yoel Feler, Haifa (IL); Mark Ghinovker, Yoqneam Ilit (IL); Vladimir Levinski, Nazareth Ilit (IL)

(73) Assignee: KLA Corporation, Milpitas, CA (US)

( * ) Notice: Subject to any disclaimer, the term of this patent is extended or adjusted under 35 U.S.C. 154(b) by 109 days.

(21) Appl. No.: 17/354,307

(22) Filed: Jun. 22, 2021

(65) Prior Publication Data

US 2021/0311401 A1 Oct. 7, 2021

Related U.S. Application Data

(62) Division of application No. 16/598,146, filed on Oct. 10, 2019, now Pat. No. 11,073,768.

(Continued)

(51) Int. Cl.
*G03F 7/00* (2006.01)
*G01N 21/95* (2006.01)
*G01N 21/956* (2006.01)

(52) U.S. Cl.
CPC ..... *G03F 7/70558* (2013.01); *G01N 21/9501* (2013.01); *G01N 21/956* (2013.01);
(Continued)

(58) Field of Classification Search
CPC .............. G01N 21/9501; G01N 21/956; G03F 7/70558; G03F 9/7069; G03F 9/7073–7084
(Continued)

(56) References Cited

U.S. PATENT DOCUMENTS 7,068,833 B1 6/2006 Ghinovker et al.
10,684,563 B2 6/2020 Manassen et al.
(Continued)

FOREIGN PATENT DOCUMENTS

CN 101040367 A 9/2007
CN 102566301 A 7/2012
(Continued)

OTHER PUBLICATIONS

International Search Report and Written Opinion dated Sep. 15, 2020 for PCT/US2020/039282.
(Continued)

*Primary Examiner* — Christina A Riddle
(74) *Attorney, Agent, or Firm* — Suiter Swantz IP

(57) ABSTRACT

A metrology system may include a controller coupled to a scanning metrology tool that images a sample in motion along a scan direction. The controller may receive an image of a metrology target on the sample from the scanning metrology tool, where the metrology target comprises a first measurement group including cells distributed along a transverse direction orthogonal to the scan direction, and a second measurement group separated from the first measurement group along the scan direction including cells distributed along the transverse direction. The controller may further generate at least a first metrology measurement based on at least one of the cells in the first measurement group, and generate at least a second metrology measurement based on at least one of the cells in the second measurement group.

12 Claims, 8 Drawing Sheets

Related U.S. Application Data

(60) Provisional application No. 62/867,142, filed on Jun. 26, 2019.

(52) U.S. Cl.
CPC ...... *G03F 7/70616* (2013.01); *G03F 7/70625* (2013.01); *G03F 7/70633* (2013.01); *G03F 7/70641* (2013.01); *G03F 7/70683* (2013.01)

(58) Field of Classification Search
USPC ............ 355/67, 68, 77; 356/237.5, 399–401
See application file for complete search history.

(56) References Cited

U.S. PATENT DOCUMENTS

| | | | |
|---|---|---|---|
| 2003/0021466 A1 | 1/2003 | Adel et al. | |
| 2006/0061743 A1* | 3/2006 | Den Boef ............. | G03F 9/7092 |
| | | | 355/53 |
| 2009/0033948 A1 | 2/2009 | Kondo | |
| 2011/0051150 A1 | 3/2011 | Choi et al. | |
| 2012/0133938 A1 | 5/2012 | Deckers et al. | |
| 2013/0100427 A1 | 4/2013 | Koolen et al. | |
| 2014/0233031 A1* | 8/2014 | Van Der Schaar ... | G03F 9/7042 |
| | | | 356/399 |
| 2015/0138555 A1* | 5/2015 | Dai ..................... | G03F 7/70633 |
| | | | 356/401 |
| 2017/0047197 A1 | 2/2017 | Hotta et al. | |
| 2017/0090302 A1 | 3/2017 | Slotboom et al. | |
| 2018/0031424 A1 | 2/2018 | Hill et al. | |
| 2018/0047646 A1 | 2/2018 | Bringoltz et al. | |

| | | | |
|---|---|---|---|
| 2019/0094702 A1* | 3/2019 | Shmarev .......... | G03F 7/706831 |
| 2019/0179231 A1 | 6/2019 | Laske et al. | |
| 2019/0228518 A1 | 7/2019 | Manassen et al. | |

FOREIGN PATENT DOCUMENTS

| | | |
|---|---|---|
| CN | 108292103 A | 7/2018 |
| CN | 111095509 A | 5/2020 |
| CN | 111433677 A | 7/2020 |
| JP | 2014160868 A | 9/2014 |
| TW | 201239547 A | 10/2012 |

OTHER PUBLICATIONS

Office Action in Chinese Application No. 202080040950.0 dated Aug. 5, 2022, 6 pages.
English Translation of Office Action in Chinese Application No. 202080040950.0 dated Aug. 5, 2022, 5 pages.
European Patent Office, Supplementary European Search Report for European Patent Application No. 20831920.2, dated Jun. 9, 2023, 9 pages.
Taiwan Patent Office, Office Action received in TW Application No. 113108119, Aug. 12, 2025, 11 pages (including translation).
Japanese Patent Office, Office Action received in JP Application No. 2021576864, May 24, 2024, 13 pages (including translation).
Korean Intellectual Property Office, Office Action received in KR Application No. 10-2022-7002542, May 2, 2025, 16 pages (including translation).
Taiwan Patent Office, Office Action received in TW Application No. 113108119, Sep. 2, 2024, 16 pages (including translation).

* cited by examiner

102

TRANSVERSE DIRECTION
310

302

414

304a

304b

306a

304c

306b

416

SCAN DIRECTION
308

304d

404

402

METROLOGY TARGET FOR SCANNING METROLOGY

CROSS-REFERENCE TO RELATED APPLICATION

The present application constitutes a divisional application of and claims priority to U.S. patent application Ser. No. 16/598,146 filed on Oct. 10, 2019, entitled METROLOGY TARGET FOR SCANNING METROLOGY, which is a non-provisional application of U.S. Provisional application Ser. No. 62/867,142, filed Jun. 26, 2019, entitled Scan Overlay (OVL) Target, both of which are incorporated herein by reference in the entirety.

TECHNICAL FIELD

The present disclosure relates generally to overlay metrology and, more particularly, to targets suitable for scanning overlay metrology systems.

BACKGROUND

Metrology systems typically provide on-product metrology by analyzing dedicated metrology targets where characteristics of fabricated pattern elements are indicative of one or more metrology metrics of interest. Shrinking design rules and more demanding specifications for on-product metrology such as, but not limited to, on-product overlay (OPO) metrology are driving increased sampling requirements at multiple levels of semiconductor manufacturing processes. This increased sampling may further enable higher complexity in overlay models and more accurate correctables for lithography systems in response to metrology data. However, increasing sampling requirements may negatively impact metrology throughput. It is therefore desirable to provide systems and methods for high-throughput metrology.

SUMMARY

A metrology system is disclosed in accordance with one or more illustrative embodiments of the present disclosure. In one illustrative embodiment, the system includes a controller coupled to a scanning metrology tool, where the scanning metrology tool images a sample in motion along a scan direction. In another illustrative embodiment, the controller receives an image of a metrology target on the sample from the scanning metrology tool. In another illustrative embodiment, the metrology target comprises a first measurement group including one or more cells distributed along a transverse direction on the sample, where the transverse direction on the sample is orthogonal to the scan direction. In another illustrative embodiment, the metrology target further comprises a second measurement group including a one or more cells distributed along the transverse direction on the sample, where the second measurement group is separated from the first measurement group along the scan direction. In another illustrative embodiment, the controller generates at least a first metrology measurement based on at least one of the first set of cells in the first metrology group. In another illustrative embodiment, the controller generates at least a second metrology measurement based on at least one of the first set of cells in the second metrology group. A metrology system is disclosed in accordance with one or more illustrative embodiments of the present disclosure.

In one illustrative embodiment, the system includes a scanning metrology tool to image a sample in motion along a scan direction. In another illustrative embodiment, the system includes a controller coupled to the scanning metrology tool. In another illustrative embodiment, the controller receives an image of a metrology target on the sample from the scanning metrology tool. In another illustrative embodiment, the metrology target comprises a first measurement group including one or more cells distributed along a transverse direction on the sample, where the transverse direction on the sample is orthogonal to the scan direction. In another illustrative embodiment, the metrology target further comprises a second measurement group including a one or more cells distributed along the transverse direction on the sample, where the second measurement group is separated from the first measurement group along the scan direction. In another illustrative embodiment, the controller generates at least a first metrology measurement based on at least one of the first set of cells in the first metrology group. In another illustrative embodiment, the controller generates at least a second metrology measurement based on at least one of the first set of cells in the second metrology group.

A metrology target is disclosed in accordance with one or more illustrative embodiments of the present disclosure. In one illustrative embodiment, the target includes a first measurement group including one or more cells distributed along a transverse direction on a sample, where the transverse direction on the sample is orthogonal to the scan direction. In another illustrative embodiment, the one or more cells in the first measurement group may be measured simultaneously by a scanning metrology tool and may further provide at least a first metrology measurement when measured with the scanning metrology tool. In another illustrative embodiment, the target includes a second measurement group including one or more cells distributed along the transverse direction on the sample, where the second measurement group separated from the first measurement group along the scan direction. In another illustrative embodiment, the one or more cells in the second measurement group may be measured simultaneously by the scanning metrology tool and may further provide at least a second metrology measurement when measured with the scanning metrology tool.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
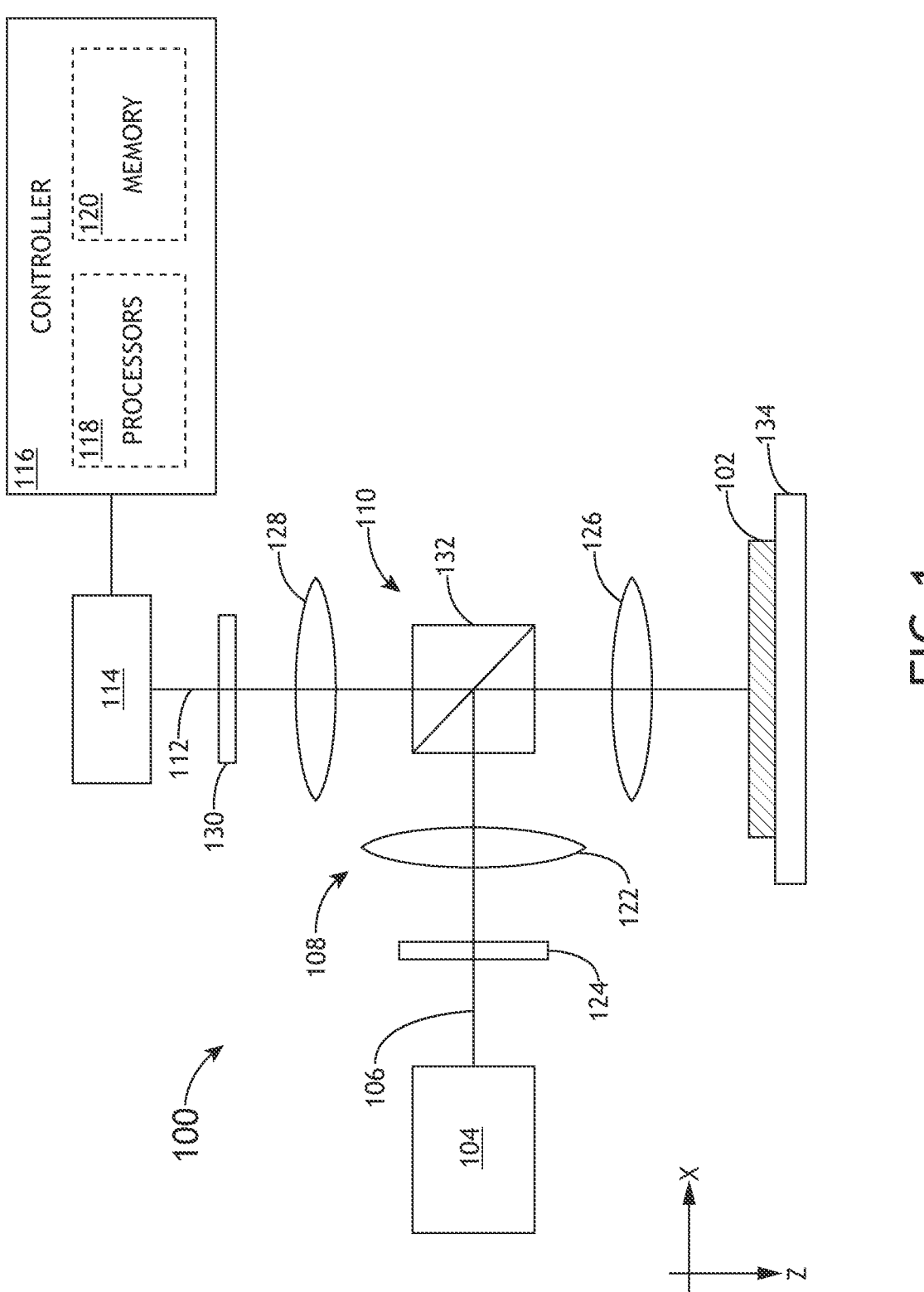
FIG. 1 is a block diagram illustrating a scanning metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scanning-based metrology in which a metrology target is characterized by a metrology tool while being translated through a focal volume of the metrology tool.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated. Further, metrology targets are typically characterized has having one or more measurement cells, where each cell includes printed elements in one or more layers on the sample. A metrology measurement may then be based on any combination of measurements of the size, orientation, or location (e.g., pattern placement) of printed elements in a single cell or between multiple cells.

For example, one or more cells of an overlay metrology target may include printed elements on two or more sample layers arranged such that the relative positions of elements of each layer may be indicative of offset errors (e.g. pattern placement errors (PPE)) in a particular layer or overlay errors associated with registration errors between sample layers. By way of another example, process-sensitive metrology targets may include printed elements on a single sample layer, where one or more characteristics of the printed elements (e.g., width or critical dimension (CD), sidewall angle, position, or the like) are indicative of one or more process metrics such as, but not limited to, the dose of illumination during a lithography step or a focal position of the sample in a lithography tool during a lithography step.

A metrology system may inspect a metrology target using a variety of techniques. For example, a metrology system may inspect a metrology target using a move-and-measure (MAM) mode of operation in which the sample is translated to place a metrology target of interest within a measurement field of view, a measurement is taken while the sample is static, and the sample is then translated to place an additional metrology target of interest in the measurement field of view. By way of another example, a metrology system may inspect a metrology target while the sample is in motion (e.g., a scanning mode of operation). For instance, a scanning metrology tool may continuously analyze a sample as it is scanned along a scan direction through a measurement field. Further, a scanning metrology tool may efficiently inspect multiple neighboring targets distributed along the scan direction in a single scan, which eliminate time-consuming settling-time requirements associated with MAM tools. Scanning metrology tools are described generally in U.S. patent application Ser. No. 15/761,830, filed on Mar. 21, 2018, which is incorporated herein by reference in its entirety.

Embodiments of the present disclosure are directed to metrology targets suitable for inspection using a scanning mode of operation. It is recognized herein that scanning metrology tools have different sources of error than MAM metrology tools due to the different operational modes. In particular, while MAM metrology tools may capture an image of one or more cells in a single frame, scanning metrology tools typically generate an image line by line as the sample is scanned. Thus, scanning metrology tools may be sensitive to time-varying errors such as, but not limited to vibration or jitter errors that impact different portions of the image to different extents.

Accordingly, scanning metrology targets designed in accordance with the present disclosure (as well as systems for measuring such targets) include one or more measurement groups, where a measurement group includes one or more cells designed for a common metrology measurement distributed along a direction orthogonal to the scan direction of the sample. In this regard, cells within each measurement group are inspected simultaneously to mitigate the impact of time-varying errors during a measurement. For example, measurement errors such as scan velocity or scan position errors are common for all cells in each measurement group, which may facilitate consistent and accurate measurements of cells within the measurement group.

Further, scanning metrology targets designed in accordance with the present disclosure may include any number of measurement groups distributed along the scan direction. Although time-varying errors may impact cells in one measurement group differently than cells in a different measurement group, these errors may have minimal impact on metrology measurements since metrology measurements typically (though not exclusively) involve cells within a single measurement group.

A measurement group may include any combination of one or more cells designed to generate any number of metrology measurements. For example, in the context of overlay metrology, a scanning metrology target may include a first measurement group with cells suitable for overlay measurements in a first direction (e.g., an X-direction) and a second measurement group with cells suitable for overlay measurements in an orthogonal second direction (e.g., a Y-direction). By way of another example, a scanning metrology target may include cells suitable for overlay measurements in both the first and second directions in a common measurement group.

Additional embodiments of the present disclosure are directed to a scanning metrology tool suitable for analyzing scanning metrology targets described herein. For example, a scanning metrology tool may continuously analyze a scanning metrology target as it is moved relative to a measurement field, receive metrology signals associated with each of the cell groups, and generate metrology data from the metrology signals. Further, the scanning metrology tool may apply a common measurement algorithm to cells within each cell group to generate metrology data from the corresponding metrology signals.

Additional embodiments of the present disclosure are directed to one or more pattern masks suitable for generating scanning metrology targets. For example, a pattern mask may include pattern elements suitable for being imaged in a lithography system onto a sample for the fabrication of a scanning metrology target. In particular, a pattern mask may include pattern elements in one or more cells of one or more cell groups associated with a particular layer to be fabricated on a sample. Further, multiple pattern masks may include pattern elements for fabrication on multiple sample layers to fabricate a multilayer scanning metrology target (e.g., a scanning overlay target, or the like).

Referring now to FIGS. 1A through 4, systems and methods for metrology with scanning metrology targets are described in greater detail.

FIG. 1 is a block diagram illustrating a scanning metrology system 100, in accordance with one or more embodiments of the present disclosure. The scanning metrology system 100 may include various components to analyze a sample 102, or a portion thereof, as the sample 102 is scanned relative to a measurement field. For example, the scanning metrology system 100 may be configured to analyze a scanning metrology target on the sample 102, which will be described in greater detail below, as the sample 102 is scanned.

In one embodiment, the scanning metrology system 100 includes an illumination source 104 configured to generate an illumination beam 106. In another embodiment, the scanning metrology system 100 includes an illumination pathway 108 including one or more components to direct the illumination beam 106 to the sample 102. In another embodiment, the scanning metrology system 100 includes a collection pathway 110 including one or more components to collect sample radiation 112. In another embodiment, the scanning metrology system 100 includes a detector 114 configured to capture at least a portion of the sample radiation 112 from the collection pathway 110. In another embodiment, the scanning metrology system 100 includes a scanning sub-system (e.g., one or more translation stages, beam scanners, or the like) configured to adjust the sample 102 and/or the illumination beam 106 prior, during, and/or after a measurement.

In another embodiment, the scanning metrology system 100 includes a controller 116. In another embodiment, the controller 116 includes one or more processors 118. In another embodiment, the one or more processors 118 are configured to execute a set of program instructions maintained in a memory medium 120, or memory. Further, the controller 116 may include one or more modules containing one or more program instructions stored in the memory medium 120 executable by the processors 118. The processors 118 of a controller 116 may include any processing element known in the art. In this sense, the processors 118 may include any microprocessor-type device configured to execute algorithms and/or instructions. In one embodiment, the processors 118 may consist of a desktop computer, mainframe computer system, workstation, image computer, parallel processor, or any other computer system (e.g., networked computer) configured to execute a program configured to operate the scanning metrology system 100, as described throughout the present disclosure. It is further recognized that the term "processor" may be broadly defined to encompass any device having one or more processing elements, which execute program instructions from a non-transitory memory medium 120.

The memory medium 120 may include any storage medium known in the art suitable for storing program instructions executable by the associated processors 118. For example, the memory medium 120 may include a non-transitory memory medium. As an additional example, the memory medium 120 may include, but is not limited to, a read-only memory, a random-access memory, a magnetic or optical memory device (e.g., disk), a magnetic tape, a solid state drive and the like. It is further noted that memory medium 120 may be housed in a common controller housing with the processors 118. In one embodiment, the memory medium 120 may be located remotely with respect to the physical location of the processors 118 and controller 116. For instance, the processors 118 of controller 116 may access a remote memory (e.g., server), accessible through a network (e.g., internet, intranet and the like). Therefore, the above description should not be interpreted as a limitation on the present invention but merely an illustration.

The controller 116 may be communicatively coupled with any components of the scanning metrology system 100. In one embodiment, the controller 116 receives data from one or more components of the scanning metrology system 100. For example, the controller 116 may receive metrology signals from the detector 114 (e.g., one or more images, or the like) associated with a scanning metrology target. In another embodiment, the controller 116 performs one or more processing steps of the present disclosure. By way of another example, the controller 116 may receive position feedback from the sample stage 134 indicative of position, velocity, or other relevant parameter. In another embodiment, the controller 116 analyzes or otherwise processes the metrology signals from the detector 114. For example, the controller 116 may generate metrology data based on the metrology signals from the scanning metrology target such as, but not limited to, overlay data, focal position of the sample 102 during one or more lithography steps, or illumination dose during one or more lithography steps. In another embodiment, the controller 116 may generate one or more control signals to direct or otherwise control components of the scanning metrology system 100. The controller 116 may generate control signals for any component of the scanning metrology system 100 including, but not limited to, the detector 114, the sample stage 134, the illumination source 104, or any components of the illumination pathway 108 or collection pathway 110.

Further, the scanning metrology system 100 may operate as any type of metrology system known in the art. In one embodiment, the scanning metrology system 100 is an imaging metrology system in which metrology data may be generated based on one or more images of the sample 102. In another embodiment, the scanning metrology system 100 is a scatterometry metrology system in which metrology data is based on one or more pupil images associated with diffraction and/or scattering of the illumination beam 106 by the sample 102.

Referring still to FIG. 1, various components of the scanning metrology system 100 will be described in greater detail.

The illumination source 104 may include any type of light source known in the art. Further, the illumination source 104 may have any selected spectral content.

In one embodiment, the illumination source 104 includes one or more coherent sources such as, but not limited to, one or more laser sources. In this regard, the illumination source 104 may produce an illumination beam 106 having high coherence (e.g., high spatial coherence and/or temporal coherence). For example, the illumination source 104 may include one or more broadband lasers such as, but not limited to, one or more supercontinuum lasers or white-light lasers. By way of another example, the illumination source 104 may include one or more narrowband lasers. By way of a further example, the illumination source 104 may include one or more tunable lasers to provide an illumination beam 106 having tunable spectral intensity. Further, a coherent illumination source 104 may be based on any type of technology or product design. For example, the illumination source 104 may include, but are not limited to, any combination of one or more fiber lasers, one or more diode lasers, or one or more gas lasers.

In another embodiment, the illumination source 104 includes one or more low-coherence sources to provide an illumination beam 106 having low or partial coherence (e.g., spatial and/or temporal coherence). For example, the illumination source 104 may include one or more light emitting diodes (LEDs). By way of another example, the illumination source 104 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 104 may include a lamp source such as, but not limited to, an arc lamp, a discharge lamp, an electrode-less lamp, or the like.

Further, the illumination source 104 may include any combination of light sources. In one embodiment, the illumination source 104 includes one or more supercontinuum laser sources to provide broadband illumination and one or more partially-coherent high-brightness LEDs to supplement gaps in the spectrum of the one or more supercontinuum laser sources.

The illumination source 104 may further provide light having any selected temporal characteristics. In one embodiment, the illumination source 104 includes one or more continuous-wave sources to provide a continuous-wave illumination beam 106. In another embodiment, the illumination source 104 includes one or more pulsed sources to provide a pulsed or otherwise modulated illumination beam 106. For example, the illumination source 104 may include one or more mode-locked lasers, one or more Q-switched lasers, or the like.

In one embodiment, the illumination pathway 108 includes one or more lenses 122. In another embodiment, the illumination pathway 108 includes one or more optical components 124 suitable for modifying and/or conditioning the illumination beam 106. For example, the one or more optical components 124 may include, but are not limited to, one or more polarizers, one or more filters, one or more beam splitters, one or more diffusers, one or more homogenizers, one or more apodizers, or one or more beam shapers.

In another embodiment, the scanning metrology system 100 includes an objective lens 126 to focus the illumination beam 106 onto the sample 102.

The sample radiation 112 may include any type of radiation emanating from the sample 102 including, but not limited to, light or particles. For example, the sample radiation 112 may include portions of the illumination beam 106 reflected and/or scattered by the sample 102. By way of another example, the sample radiation 112 may include luminescence induced by absorption of the illumination beam 106 by the sample 102. By way of another example, the sample radiation 112 may include particles from the sample 102 in response to the illumination beam 106 such as, but not limited to, backscattered electrons or secondary electrons.

In one embodiment, the collection pathway 110 includes one or more lenses 128. In another embodiment, the collection pathway 110 includes one or more optical components 130 suitable for modifying and/or conditioning the illumination beam 106. For example, the one or more optical components 130 may include, but are not limited to, one or more polarizers, one or more filters, one or more beam splitters, one or more diffusers, one or more apodizers, or one or more beam shapers.

In another embodiment, the scanning metrology system 100 includes a beamsplitter 132. For example, as illustrated in FIG. 1, the beamsplitter 132 may be common to both the illumination pathway 108 and the collection pathway 110 such that the objective lens 126 may both direct the illumination beam 106 to the sample 102 and collect the sample radiation 112. In another embodiment, though not shown, the illumination pathway 108 and the collection pathway 110 may include separate lenses to direct the illumination beam 106 to the sample 102 and collect the sample radiation 112, respectively.

The detector 114 may include any optical detector known in the art suitable for capturing sample radiation 112 received from the sample 102. In one embodiment, the detector 114 includes a multipixel detector suitable for capturing one or more images. For example, the detector 114 may include, but is not limited to, a charge-coupled device (CCD), a complementary metal-oxide semiconductor (CMOS) device. The detector 114 may be located at any imaging plane of the scanning metrology system 100. For instance, the detector 114 may be located at a plane conjugate to the sample 102 to generate an image of the sample 102. In another instance, the detector 114 may be located at a pupil plane (or a conjugate thereof) to generate a pupil image.

Further, the scanning metrology system 100 may include multiple detectors 114 (e.g. associated with multiple beam paths generated by one or more beamsplitters to facilitate multiple metrology measurements (e.g. multiple metrology tools) by the scanning metrology system 100. In another embodiment, a detector 114 may include a spectroscopic detector suitable for identifying wavelengths of radiation emanating from the sample 102.

In another embodiment, the scanning metrology system 100 includes a scanning sub-system to scan the sample 102 with respect to the measurement field during a metrology measurement. In one embodiment, as illustrated in FIG. 1, the scanning sub-system includes a sample stage 134 to secure and/or position the sample 102 within a measurement field of the scanning metrology system 100. For example, the sample stage 134 may position and orient the sample 102 within a focal volume of the objective lens 126. In another embodiment, the sample stage 134 includes one or more adjustable stages such as, but not limited to, a linear translation stage, a rotational stage, or a tip/tilt stage. In another embodiment, though not shown, the scanning sub-system includes one or more beam-scanning optics (e.g., rotatable mirrors, galvanometers, or the like) to scan the illumination beam 106 with respect to the sample 102).

The detector 114 may be configured to generate metrology signals (e.g., sample-plane and/or pupil-plane images) during a scan using any technique known in the art. In one embodiment, the detector 114 includes a 2D pixel array with a capture time and/or a refresh rate sufficient to capture one or more images during a scan within selected image tolerances (e.g., image blur, contrast, sharpness, or the like). In another embodiment, the detector 114 includes a line-scan detector to continuously generate an image one line of pixels at a time. In another embodiment, the detector 114 includes a time-delay integration (TDI) detector. A TDI detector may generate a continuous image of the sample 102 when the motion of the sample 102 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 102 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

Figure 2:
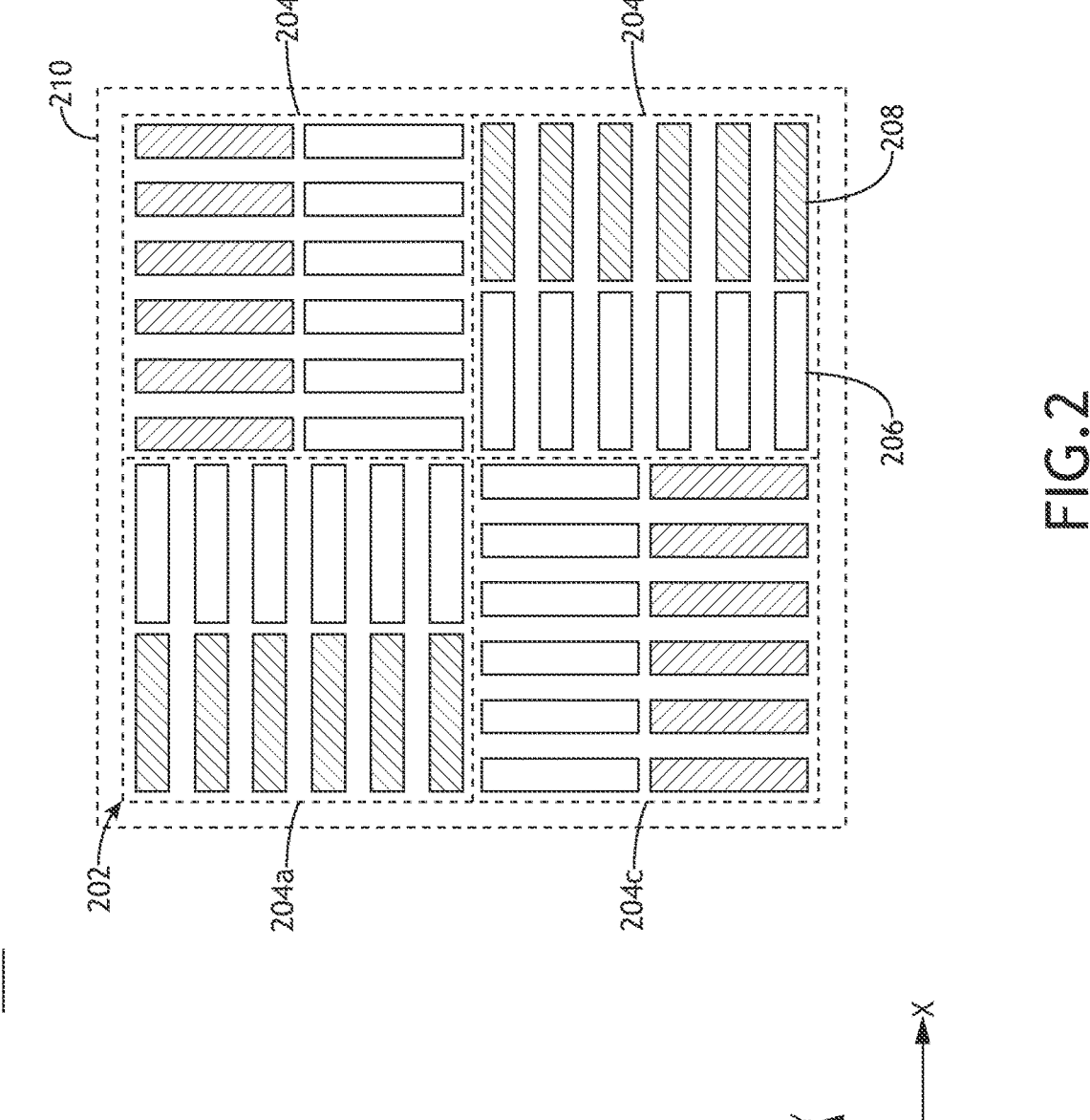
FIG. 2 is a top view of a static metrology target suitable for static mode metrology measurements in which a sample is stationary during a measurement, in accordance with one or more embodiments of the present disclosure.
Figure 3:
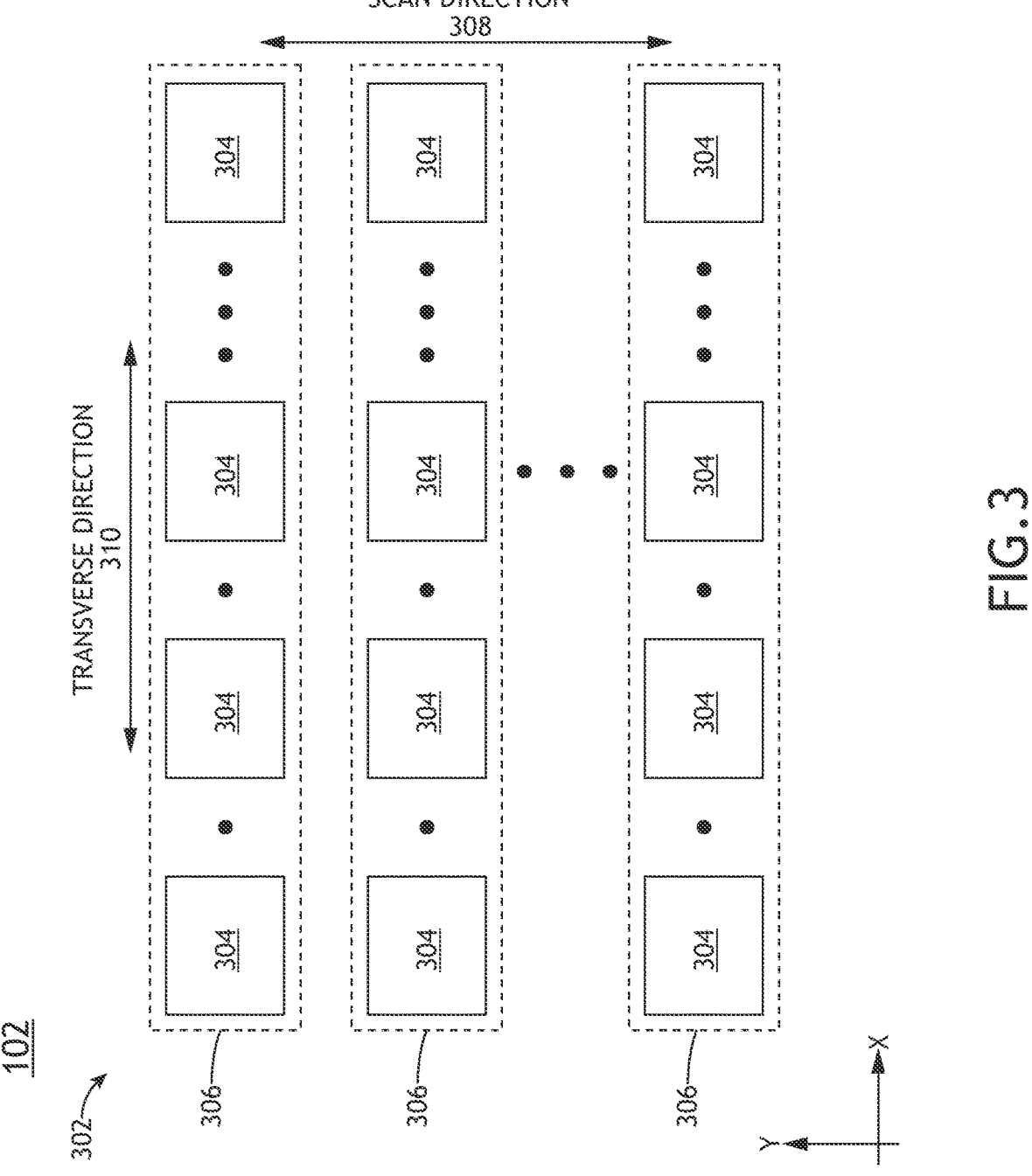
FIG. 3 is a conceptual view of a scanning metrology target, in accordance with one or more embodiments of the present disclosure.

Referring now to FIGS. 2 through 4, various metrology target designs are described in greater detail.

FIG. 2 is a top view of a static metrology target 202 suitable for static mode (e.g., frame mode) metrology measurements in which a sample 102 is stationary during a measurement, in accordance with one or more embodiments of the present disclosure.

For example, the static metrology target 202 in FIG. 2 may be suitable for overlay metrology to determine registration errors between two layers of the sample 102. In particular, the static metrology target 202 may include four cells 204a-d, represented here as quadrants of the static metrology target 202. Each cell 204a-d may include first-layer printed elements 206 located on a first layer of the sample 102 and second-layer printed elements 208 located on a second layer of the sample 102.

Further, cell 204a and cell 204d may be configured to provide overlay measurements along the X direction as illustrated in FIG. 2. For instance, an overlay measurement along the X direction may be made by directly comparing relative positions of the first-layer printed elements 206 and the second-layer printed elements 208 within each cell or between cell 204a and cell 204d. In another instance, an overlay measurement along the X direction may be made by comparing a point of rotational symmetry (e.g., rotational symmetry, reflection symmetry, mirror symmetry, or the like) between first-layer printed elements 206 distributed across cell 204a and cell 204d with a point of symmetry between second-layer printed elements 208 distributed across cell 204a and cell 204d. Similarly, cell 204b and cell 204c may be configured to provide overlay measurements along the Y direction as illustrated in FIG. 2.

It is recognized herein that a metrology tool configured for static measurements (e.g., a MAM operational mode) may capture an image of the static metrology target 202 in a single measurement field of view 210 (e.g., a single frame). Accordingly, the impact of time-varying errors in the metrology tool on the metrology measurements may be generally limited to those occurring in a timeframe on the order of the exposure time required to generate the image of the full static metrology target 202. Further, since all of the cells 204a-d are imaged simultaneously in a single image, any time-varying errors will have a common impact on various portions of the image. In this regard, time-varying errors may generally not introduce differences between a portion of the image associated with cell 204a (or cell 204b) and a portion of the image associated with cell 204d (or cell 204c).

However, it is further recognized herein that scanning metrology system 100 configured for scanning measurements may generate an image of the static metrology target 202 line by line as the sample 102 is translated through a measurement field. Accordingly, time-varying errors may introduce differences between the portion of the image associated with cell 204a (or cell 204b) and the portion of the image associated with cell 204d (or cell 204c) that may directly impact the overlay metrology measurement.

Figure 4A:
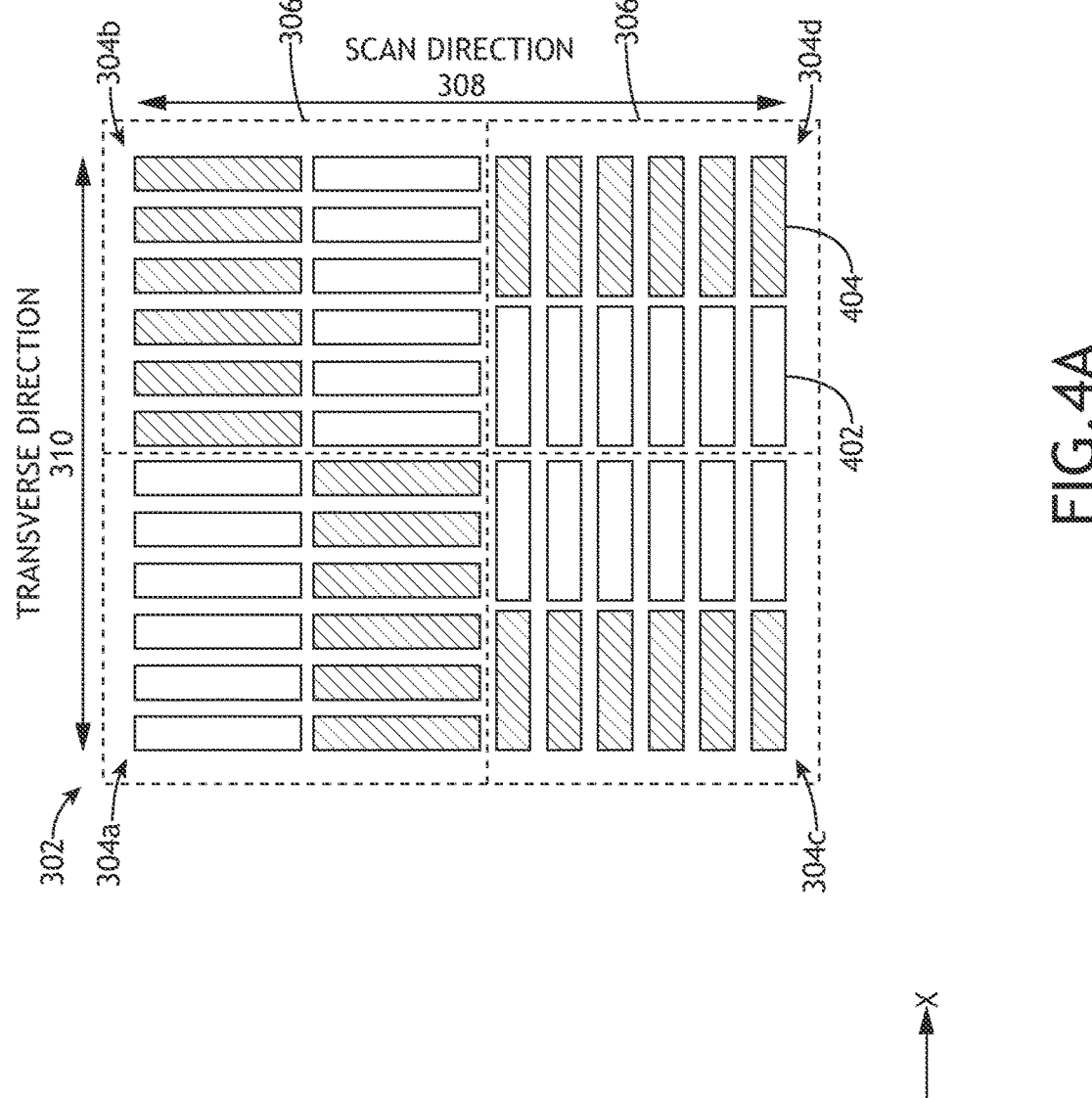
FIG. 4A is a top view of the scanning metrology target having two measurement groups for overlay metrology along orthogonal directions, where cells within each of the two measurement groups display rotation symmetry, in accordance with one or more embodiments of the present disclosure.
Figure 4B:
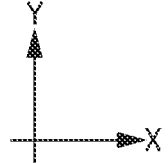
FIG. 4B is a top view of the scanning metrology target having two measurement groups for overlay metrology along orthogonal directions, where cells within each of the two measurement groups display rotation symmetry, in accordance with one or more embodiments of the present disclosure.
Figure 4C:
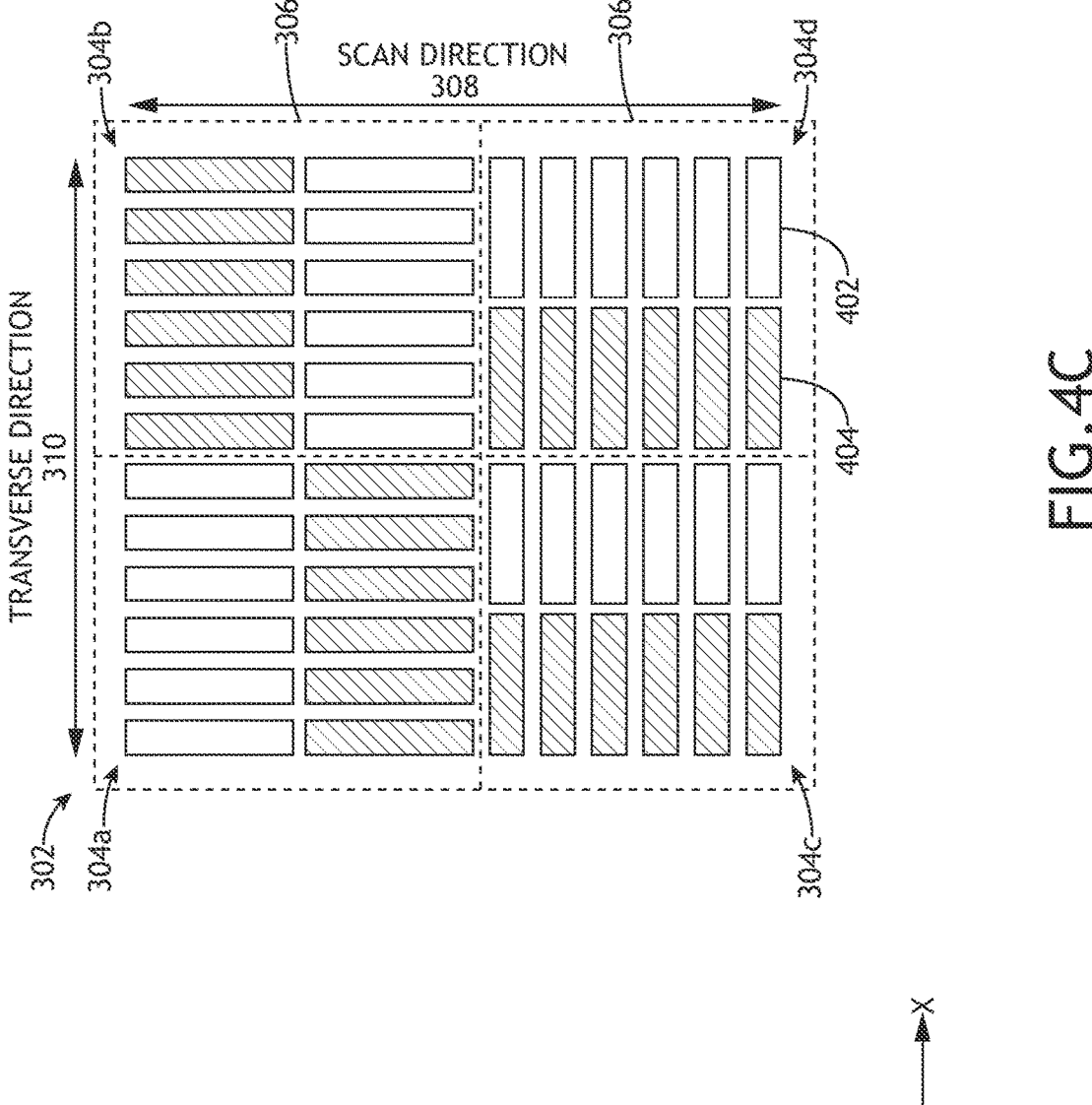
FIG. 4C is a top view of the scanning metrology target having multiple identical cells in accordance with one or more embodiments of the present disclosure.
Figure 4D:
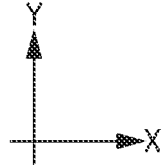
FIG. 4D is a top view of the scanning metrology target having two measurement groups, where cells within each of the two measurement groups display reflection symmetry, in accordance with one or more embodiments of the present disclosure.
Figure 5:
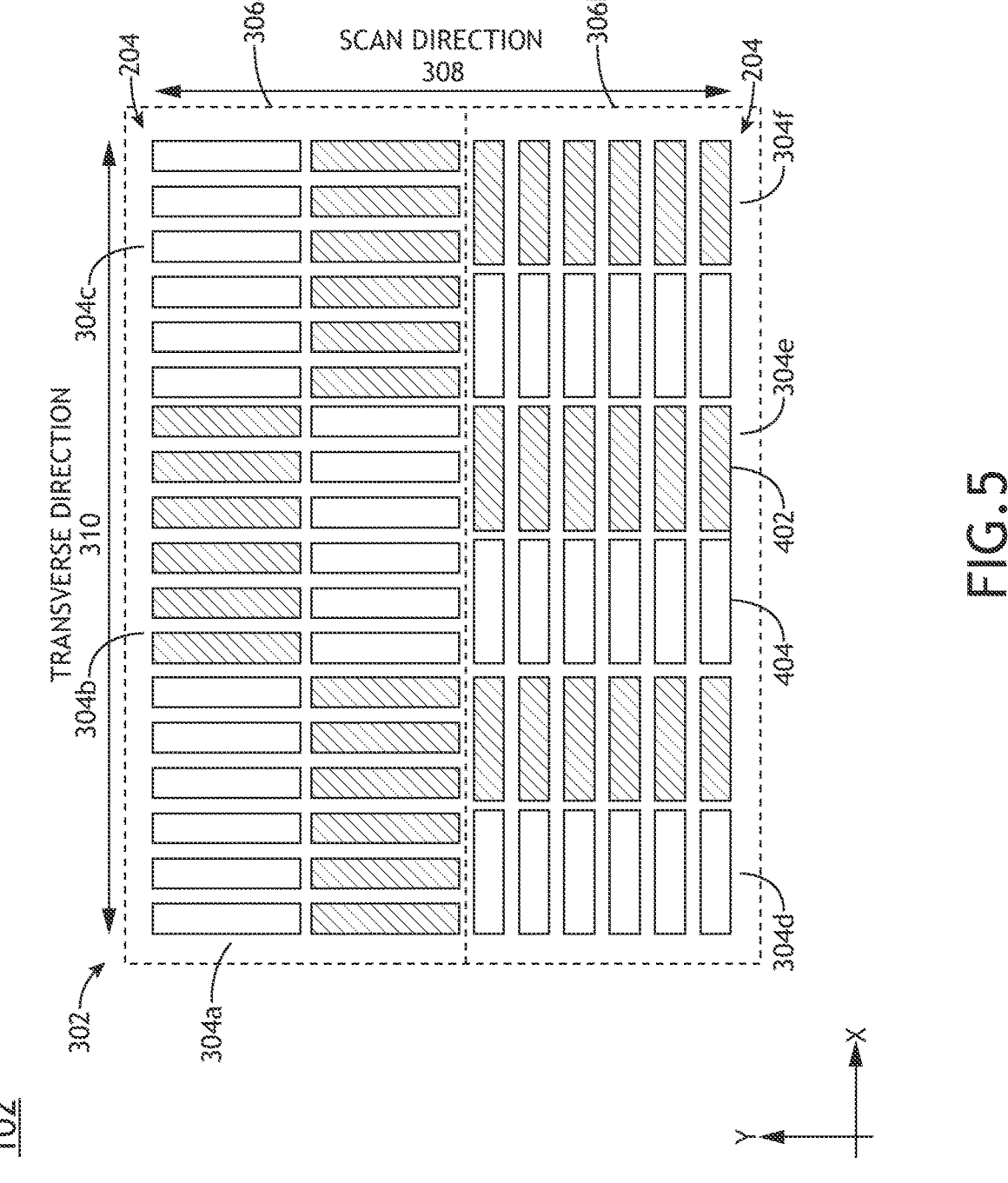
FIG. 5 is a top view of the scanning metrology target having two cell groups with three cells each for overlay metrology along orthogonal directions, in accordance with one or more embodiments of the present disclosure.

Referring now to FIGS. 3 through 5, metrology targets suitable for scanning mode measurement are described in accordance with one or more embodiments of the present disclosure.

FIG. 3 is a conceptual view of a scanning metrology target 302, in accordance with one or more embodiments of the present disclosure.

In one embodiment, the scanning metrology target 302 includes multiple measurement cells 304 distributed on the sample 102, where each cell 304 includes printed elements on one or more layers of the sample 102 designed to provide a selected metrology measurement. For example, an overlay metrology measurement may utilize relative positions between pattern elements on two or more layers of the sample 102 to determine registration errors of the associated layers during lithography, where the pattern elements are located in one or more cells 304 of the scanning metrology target 302. By way of another example, a cell 304 may include printed elements on one or more sample layers, where characteristics such as, but not limited to, the size, critical dimension (CD), or position are indicative of one or more process parameters during exposure (e.g., focal position of the sample 102, illumination dose, or the like).

In another embodiment, cells 304 in the scanning metrology target 302 are organized within one or more measurement groups 306 distributed along the scan direction 308 (e.g., the direction in which the sample 102 is scanned during a measurement). For example, each measurement group 306 may include any number of cells 304 distributed along a transverse direction 310 orthogonal to the scan direction 308 and the scanning metrology target 302 may include any number of measurement groups 306 along the scan direction 308.

It is recognized herein that the scanning metrology system 100 may have multiple sources of error associated that may negatively impact metrology performance. In particular, since the scanning metrology system 100 generates a continuous image along a scan, the impact of time-varying errors such as, but not limited to vibration or jitter may manifest as variations of certain portions of the continuous image with respect to other portions (e.g., spatial variations in the continuous image). For example, errors associated with the scan direction 308 may induce lateral shifting of certain portions of a continuous image along the transverse direction. By way of another example, errors associated with the translation speed (e.g., scan speed) along the scan direction 308 may manifest as stretching or compression of portions of the continuous image.

In the context of metrology, spatial variations in the continuous image caused by system-induced errors may negatively impact the performance of metrology algorithms designed to extract information about a sample from the image. For example, overlay metrology may measure registration errors between sample layers based on relative positions of imaged features on two or more layers of the sample 102. However, spatial variations in the image may directly impact the locations of features in the image and may thus directly contribute to a measurement error. By way of another example, critical dimension metrology may measure a feature size on a sample based on a size of the feature in an image. However, spatial variations in the image may directly impact the imaged sizes of features at different locations along the scan direction 308 and may thus directly contribute to inconsistent measurement results along the scan direction 308.

Accordingly, in embodiments of the present disclosure, cells 304 associated with a common metrology measurement may be arranged to be located within a common measurement group 306. In this regard, the cells 304 within each measurement group 306 may be measured simultaneously to mitigate impacts of time-varying errors. It is recognized herein that time-varying errors may still impact cells 304 within each measurement group 306. However, only time-varying errors occurring on a timescale on the order of the measurement time of a measurement group 306 (e.g., approximately a size of a largest cell 304 measured along the scan direction 308). Further, even those errors occurring on this timescale will similarly impact all cells 304 in the measurement group 306.

However, it is to be understood that a metrology algorithm is not precluded from utilizing cells 304 in different measurement groups 306. It is merely contemplated herein that increasing the size of a portion of an image along the scan direction 308 analyzed may increase the impact of time-varying errors.

A scanning metrology target 302 may include any selected number of measurement groups 306, each including any number of cells 304 suitable for any selected metrology measurement. In one embodiment, the scanning metrology target 302 may include a first measurement group 306 having one or more cells 304 designed to provide overlay measurements along a first direction (e.g., an X direction) and a second measurement group 306 having one or more cells 304 designed to provide overlay measurements along a second direction (e.g., an Y direction). In this regard, the cells 304 in the first measurement group 306 associated with overlay metrology along the first direction may be measured simultaneously to provide accurate metrology data. Similarly, the cells 304 in the second measurement group 306 associated with overlay metrology along the first direction may be measured simultaneously. In another embodiment, the scanning metrology target 302 may include one or more cells 304 in a common measurement group 306 designed to provide overlay measurements along multiple directions (e.g., X and Y directions). In this regard, the cells 304 in the common measurement group 306 associated with overlay metrology along the multiple directions may be measured simultaneously. In another embodiment, the scanning metrology target 302 may include one or more cells 304 designed to provide CD metrology in a common measurement group 306 to minimize or otherwise mitigate the impact of time-varying errors on CD measurements for features at different locations in the scanning metrology target 302. In another embodiment, the scanning metrology target 302 may include one or more cells 304 designed to provide process metrology data (e.g., illumination dose, focal position, or the like in a lithography tool) in a common measurement group 306 to minimize or otherwise mitigate the impact of time-varying errors on the process metrology measurements. Accordingly, it is to be understood that the examples providing a specific number or layout of measurement groups 306 in a scanning metrology target 302 are provided solely as illustrations and should not be interpreted as limiting.

In one embodiment, the scanning metrology target 302 includes one or more measurement groups 306 in which various measurement groups 306 within each measurement group 306 provide metrology measurements (e.g., overlay, process monitoring, or the like) associated with a common direction on the sample 102. For example, a scanning metrology target 302 may include a first measurement group 306 may include cells 304 providing metrology measurements along a first direction and a second measurement group 306 may include cells 304 providing metrology measurements along a second direction different than the first direction. The first and second directions may be, but are not required to be, orthogonal. Further, the first and second directions may correspond to, but are not required to correspond to, the scan direction 308 and the transverse direction 310.

Additionally, the measurement groups 306 may include cells 304 having printed elements having any selected pattern suitable for providing a selected metrology measurement of interest. In one embodiment, the measurement groups 306 include at least one cell 304 having periodic printed elements. For example, periodic printed elements may include multiple (e.g., three or more) elements having a common spacing along a selected direction. Further, the multiple elements may have, but are not required to have, a common size.

Referring now to FIGS. 4A through 5, various configurations of a scanning metrology target 302 are described in accordance with one or more embodiments of the present disclosure. For example, it is contemplated herein that an overlay may be designed to provide overlay measurements based on any measurement algorithm known in the art. For instance, an overlay measurement along a measurement direction may be generated by directly comparing the relative positions or points of symmetry (e.g., rotational symmetry, reflection symmetry, or the like) of printed elements generated using different exposure steps. Further, while the configurations of a scanning metrology target 302 illustrated in FIGS. 4A through 5 are designed for overlay metrology, it is to be understood that a scanning metrology target 302 configured according to the present disclosure is not limited to overlay metrology. Accordingly, it is contemplated herein that one of ordinary skill in the art could extend the features and principles of operation described in the illustrated embodiments herein to additional metrology target designs.

FIG. 4A is a top view of the scanning metrology target 302 having two measurement groups 306a,b for overlay metrology along orthogonal directions, where cells 304 within each of the two measurement groups 306a,b display rotation symmetry, in accordance with one or more embodiments of the present disclosure.

In one embodiment, the scanning metrology target 302 includes a first measurement group 306a including a first cell 304a and a second cell 304b distributed along the transverse direction 310, and a second measurement group 306b including a third cell 304c and a fourth cell 304d distributed along the transverse direction 310. The second measurement group 306b is separated from the first measurement group 306a along the scan direction 308. Further, cells 304a-d are depicted as having first set of printed elements 402 and a second set of printed elements 404. The first set of printed elements 402 and the second set of printed elements 404 may be printed using different processing steps. For example, the first set of printed elements 402 may be fabricated on a first layer of the sample 102 and the second set of printed elements 404 may be fabricated on a second layer of the sample. By way of another example, the first set of printed elements 402 and the second set of printed elements 404 may be fabricated on a common layer of the sample 102 in different processing steps.

Additionally, any of the cells 304a-d may include cells 304 having printed elements having any selected pattern suitable for providing a selected metrology measurement of interest. For example, the measurement group 306a and/or the measurement group 306b may include at least one cell 304 having periodic printed elements. For example, periodic printed elements may include multiple (e.g., three or more) elements having a common spacing along a selected direction. Further, the multiple elements may have, but are not required to have, a common size.

In one embodiment, the first cell 304a and the second cell 304b in the first measurement group 306a are configured to provide overlay measurements along a first direction (e.g., the X direction), while third cell 304c and the fourth cell 304d in the second measurement group 306b are configured to provide overlay measurements along a second direction (e.g., the Y direction). In this regard, the first cell 304a and the second cell 304b in the first measurement group 306a may be imaged simultaneously to minimize or otherwise mitigate the impact of time-varying errors on the associated metrology measurement along the first direction. Similarly, the third cell 304c and the fourth cell 304d in the second measurement group 306b may also be imaged simultaneously to minimize or otherwise mitigate the impact of time-varying errors on the associated metrology measurement along the second direction.

Further, the scanning metrology target 302 in FIG. 4A may be well-suited for, but is not limited to, overlay metrology based on rotational symmetry of the cells 304. For example, cell 204b may be designed to correspond to a 180-degree rotation of cell 204a in the case of no overlay error such that an overlay measurement along the X direction may be generated by comparing a point of rotational symmetry 406 of the first set of printed elements 402 in the measurement group 306a to a point of rotational symmetry 408 of the second set of printed elements 404 in the measurement group 306a. Similarly, cell 204d in FIG. 4A may be designed to correspond to a 180-degree rotation of cell 204c in the case of no overlay error such that an overlay measurement along the Y direction may be generated by comparing a point of rotational symmetry 410 of the first set of printed elements 402 in the measurement group 306b to a point of rotational symmetry 412 of the second set of printed elements 404 in the measurement group 306b. In this regard, a measurement of rotationally-symmetric cells 304 may mitigate or otherwise reduce rotation errors of the scanning metrology system 100.

It is contemplated herein that various arrangements of elements within the cells 304 of a measurement group 306 may provide a desired symmetry. FIG. 4B is a top view of the scanning metrology target 302 having two measurement groups 306a,b for overlay metrology along orthogonal directions, where cells 304 within each of the two measurement groups 306a,b display rotation symmetry, in accordance with one or more embodiments of the present disclosure. In particular, the cells 304c,d in measurement group 306b of FIG. 4B are distributed along the Y direction (e.g., the measurement direction) to increase the length of the measurement group 306b along the Y direction relative to the scanning metrology target 302 in FIG. 4A.

It is additionally contemplated herein that a scanning metrology target 302 may be suitable for scanning in multiple directions, which may facilitate comparisons of measurements taken along different directions with a common target. For example, the scanning metrology target 302 in FIG. 4B may be scanned along the X direction (e.g., the scan direction 308 and the transverse direction 310 as shown in FIG. 4B may be swapped).

It is to be understood, however, that the 180-degree rotational symmetry illustrated in FIGS. 4A and 4B are provided solely for illustrative purposes and should not be interpreted as limiting. Rather, the scanning metrology target 302 (or any groups of cells 304 in a measurement group 306) may correspond to versions of each other rotated by any amount (e.g., 45 degrees, 90 degrees, or the like).

Further, as described previously herein, cells 304 in a measurement group 306 need not have any rotational symmetry.

In another embodiment, a measurement group 306 includes multiple identical cells 304. FIG. 4C is a top view of the scanning metrology target 302 having multiple identical cells 304c,d, in accordance with one or more embodiments of the present disclosure. Accordingly, an overlay measurement along the Y direction may be generated by performing overlay measurements on cell 304c and cell 304d separately (e.g., based on relative positions and/or points of symmetry of first set of printed elements 402 and second set of printed elements 404 in cell 304c and cell 304d, respectively, and then averaging the separate measurements to cancel rotation errors of the scanning metrology system 100.

In another embodiment, a measurement group 306 includes one or more pairs of cells 304 designed to have reflection symmetry (e.g., mirror symmetry, 1-D symmetry, or the like) along a desired measurement direction (e.g., the X direction, the Y direction, or the like). FIG. 4D is a top view of the scanning metrology target 302 having two measurement groups 306a,b, where cells 304 within each of the two measurement groups 306a,b display reflection symmetry, in accordance with one or more embodiments of the present disclosure. For example, the first set of printed elements 402 and second set of printed elements 404 in the measurement group 306a may be designed to be symmetric about the axis 414 such that an overlay measurement along the X direction may be associated with a comparison of the axis of symmetry of the first set of printed elements 402 in the measurement group 306a with the axis of symmetry of the second set of printed elements 404 in the measurement group 306a. Similarly, the first set of printed elements 402 and second set of printed elements 404 in the measurement group 306b may be designed to be symmetric about the axis 416 such that an overlay measurement along the Y direction may be associated with a comparison of the axis of symmetry of the first set of printed elements 402 in the measurement group 306b with the axis of symmetry of the second set of printed elements 404 in the measurement group 306b.

In another embodiment, a measurement group 306 includes multiple cells 304 providing the same metrology measurement, but having different layouts of printed elements (e.g., the first set of printed elements 402 and the second set of printed elements 404). For example, the printed elements in the cells 304 may include variations of the pitch between elements, segmentations of the elements, element asymmetries, or the like. In this regard, metrology signals associated with the multiple cells 304 may be used to monitor process errors and/or pattern placement errors (PPE), where the variations in the printed elements are sensitive to process errors.

In another embodiment, a particular cell 304 may include pattern elements (e.g., gratings or the like) having intentionally inserted skews (e.g., offsets). In this regard, metrology measurements of the cell 304 may be utilized to provide residual minimization by algorithms and/or flags.

It is to be understood, however, that the illustrations of measurement groups 306 having two cells 304 each in FIGS. 4A through 4D are provided solely for illustrative purposes and should not be interpreted as limiting. The measurement groups 306 of the scanning metrology target 302 may include any number of cells 304.

FIG. 5 is a top view of the scanning metrology target 302 having two measurement groups 306 with three cells 304 each for overlay metrology along orthogonal directions, in accordance with one or more embodiments of the present disclosure. For example, the scanning metrology target 302 may include a first measurement group 306*a* having cells 304*a-c* and a second measurement group 306*b* having cells 304*d-f*. Further, as illustrated in FIG. 5, the symmetries between cells 304 may differ between the different measurement groups 306. For example, the first measurement group 306*a* includes cells 304 with two rotational variants, while the second measurement group 306*b* includes identical cells 304.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology target comprising:
a first measurement group including a first set of two or more cells distributed and aligned along a transverse direction on a sample, wherein the first set of two or more cells are arranged in a single row along the transverse direction and are configured to be measured simultaneously during a scan along a scan direction by a scanning metrology tool, wherein the transverse direction on the sample is orthogonal to the scan direction, wherein the first set of two or more cells of the first measurement group exclusively include grating structures having periodicity along a first direction, wherein the first set of two or more cells in the first measurement group are configured to provide at least a first metrology measurement associated with the first direction when characterized by the scanning metrology tool during the scan along the scan direction, wherein the distribution of the first set of two or more cells in the first measurement group along the transverse direction provides that time-varying errors associated with the first metrology measurement are common to the first set of two or more cells; and
a second measurement group including a second set of two or more cells distributed and aligned along the transverse direction on the sample, wherein the second set of two or more cells are arranged in a single row along the transverse direction and are configured to be measured simultaneously during the scan along the scan direction by the scanning metrology tool, wherein the second measurement group is separated from the first measurement group along the scan direction, wherein the second set of two or more cells of the second measurement group exclusively include grating structures having periodicity along a second direction different than the first direction, wherein the second set of two or more cells in the second measurement group are configured to provide at least a second metrology measurement associated with the second direction when characterized by the scanning metrology tool during the scan along the scan direction, wherein the distribution of the second set of two or more cells in the second measurement group along the transverse direction provides that time-varying errors associated with the second metrology measurement are common to the second set of two or more cells.

2. The metrology target of claim 1 comprising:
one or more additional measurement groups each including two or more cells distributed along the transverse direction on the sample, the one or more additional measurement groups separated from the first and second measurement groups along the scan direction, wherein the two or more cells in each of the one or more additional measurement groups are configured to provide at least one or more additional metrology measurements when characterized by the scanning metrology tool during the scan along the scan direction, wherein the distribution of the two or more cells in each of the one or more additional measurement groups along the transverse direction provides that time-varying errors associated with the one or more additional metrology measurements are common to the respective one or more additional measurement groups.

3. The metrology target of claim 1, wherein the first metrology measurement comprises:

an overlay metrology measurement along the first direction on the sample, wherein the second metrology measurement comprises:

an overlay metrology measurement along the second direction on the sample different than the first direction.

4. The metrology target of claim 3, wherein the overlay measurement along the first direction on the sample is based on relative positions of the grating structures in the one or more first cells of the first measurement group, wherein the overlay measurement along the second direction on the sample is based on relative positions of the grating structures in the one or more second cells of the second measurement group.

5. The metrology target of claim 3, wherein the overlay measurement along the first direction on the sample is based on relative positions of centers of rotational symmetry of the grating structures in the first measurement group, wherein the overlay measurement along the second direction on the sample is based on relative positions of centers of rotational symmetry of the grating structures in the second measurement group.

6. The metrology target of claim 3, wherein the overlay measurement along the first direction on the sample is based on relative positions of axes of reflection symmetry of the grating structures in the first measurement group, wherein the overlay measurement along the second direction on the sample is based on relative positions of axes of reflection symmetry of the grating structures in the second measurement group.

7. The metrology target of claim 1, wherein at least one of the first set of two or more cells or the second set of two or more cells includes two or more identical cells.

8. The metrology target of claim 1, wherein at least one of the first measurement group or the second measurement group includes a cell having a set of periodic printed elements.

9. The metrology target of claim 1, wherein at least one of the first metrology measurement or the second metrology measurement comprises:

a process parameter of a lithography tool when fabricating one or more layers of the sample.

10. The metrology target of claim 9, wherein the process parameter comprises:

at least one of a focal position of the sample or an illumination dose on the sample when exposing any of the one or more layers of the sample in the lithography tool.

11. The metrology target of claim 1, wherein at least one of the first metrology measurement or the second metrology measurement comprises:

at least one of an overlay metrology measurement, a critical dimension metrology measurement, or a sidewall angle measurement.

12. The metrology target of claim 1, wherein at least one of the first metrology measurement or the second metrology measurement comprises:

at least one of a size, location, or orientation of one or more printed elements on the sample.

\* \* \* \* \*